US006252166B1

(12) United States Patent
Leschinger

(10) Patent No.: US 6,252,166 B1
(45) Date of Patent: Jun. 26, 2001

(54) GROUNDING BRACKET FOR ELECTRICAL EQUIPMENT ENCLOSURE

(75) Inventor: Matthew Leschinger, Wheaton, IL (US)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 09/382,942

(22) Filed: Aug. 25, 1999

(51) Int. Cl.[7] ........................................ H05K 5/02
(52) U.S. Cl. ........................................ 174/51; 439/92
(58) Field of Search ........................ 174/51, 135, 40 CC, 174/35 R; 439/92, 798, 95; 248/205.1; 220/690

(56) References Cited

U.S. PATENT DOCUMENTS

| | | | | |
|---|---|---|---|---|
| 3,122,604 | * | 2/1964 | Cook et al. | 174/51 |
| 3,714,614 | * | 1/1973 | Ludwig | 174/51 X |
| 3,718,884 | * | 2/1973 | Sheldon | 174/51 X |
| 3,781,757 | * | 12/1973 | Barnes | 439/95 |
| 3,890,026 | * | 6/1975 | Gartland, Jr. | 174/51 X |
| 4,745,523 | * | 5/1988 | Moreau et al. | 174/51 X |
| 4,926,009 | * | 5/1990 | Van Leeuwen | 174/135 |
| 4,930,738 | * | 6/1990 | Lombardo | 248/205.1 |
| 4,960,964 | * | 10/1990 | Schnell et al. | 174/51 |
| 5,777,263 | * | 7/1998 | Maehler et al. | 174/51 |
| 5,866,844 | * | 2/1999 | Osterbrock et al. | 174/51 |

* cited by examiner

*Primary Examiner*—Dean A. Reichard
*Assistant Examiner*—Dhiru R Patel
(74) *Attorney, Agent, or Firm*—Jones, Day, Reavis & Pogue

(57) ABSTRACT

A grounding bracket for use in an electrical equipment pedestal is structured from stamped and formed sheet metal member having a generally U-shaped portion with two opposed ends. A pair of mounting ears extend laterally, each from an end of the U-shaped portion. A support portion extends laterally from a bight portion of the U-shaped portion and a bar extends at an angle from the support portion so as to be offset from the U-shaped portion and to lie in a plane which is substantially parallel to a plane containing the ears. By this arrangement, the bracket can be readily bolted to a universal mounting plate and provide for single-point grounding connections either to the front or rear of the bracket.

5 Claims, 2 Drawing Sheets

GROUNDING BRACKET FOR ELECTRICAL EQUIPMENT ENCLOSURE

BACKGROUND OF THE INVENTION

1. Field of the Invention

The present invention relates generally to the construction of a pedestal enclosure for housing power and communications equipment and, more particularly, to a grounding bracket for use in such an enclosure which provides for readily accessible and convenient termination of ground wires and cables within the enclosure.

2. Description of the Related Art

Communications, cable television, power distribution equipment and the like including primary cable loops, terminal blocks and connections between the primary cable loops and terminal blocks are often located outside in a right-of-way. To protect such equipment from the environment, as well as human interference, the equipment is typically housed within a pedestal enclosure. The pedestal is usually constructed as to be partially buried in the ground and to have a removable cover so that cable splices and terminations can be easily made such as on a structure known as a universal mounting plate. An example of such a pedestal is disclosed in U.S. Pat. No. 5,210,374 issued to Channell.

It is common in cable routing and distribution systems to use ground wires and cables for bonding and grounding of electrical equipment. In telephone distribution systems, for example, a pedestal may be used for service drops wherein ground wires are used to prevent electrical interference. Also, where power distribution systems use pedestals, a ground rod may be driven next to the pedestal and connected to a ground terminal within the pedestal. In such cases, space considerations and internal structure of pedestal design are significant factors for convenience of electrical wire or cable termination and wire and cable routing within the pedestal. Accordingly, it is desirable to provide a grounding system for terminating ground wires and cables within a pedestal which is readily accessible and convenient to use. It is further desirable to provide such a grounding system that is cost-effective to manufacture and install in a pedestal. Still further, it is desirable to provide such a grounding system that can serve alternatively as grounding means for communications equipment and also electrical power equipment.

SUMMARY OF THE INVENTION

The present invention improves over the prior art by providing a grounding bracket for use in a pedestal. The bracket consists of a stamped and formed sheet metal member having a generally U-shaped portion with two opposed ends. A pair of mounting ears extend laterally, each from an end of the U-shaped portion. A support portion extends laterally from a bight portion of the U-shaped portion and a bar extends at an angle from the support portion so as to be offset from the U-shaped portion and to lie in a plane which is substantially parallel to a plane containing the ears. By this arrangement, the bracket can be readily bolted to a universal mounting plate and provide for single-point grounding connections either to the front or rear of the bracket.

BRIEF DESCRIPTION OF THE DRAWINGS

The foregoing and other novel features and advantages of the invention will be better understood upon a reading of the following detailed description taken in conjunction with the accompanying drawings wherein.

DETAILED DESCRIPTION OF THE PREFERRED EMBODIMENT

Figure 1:
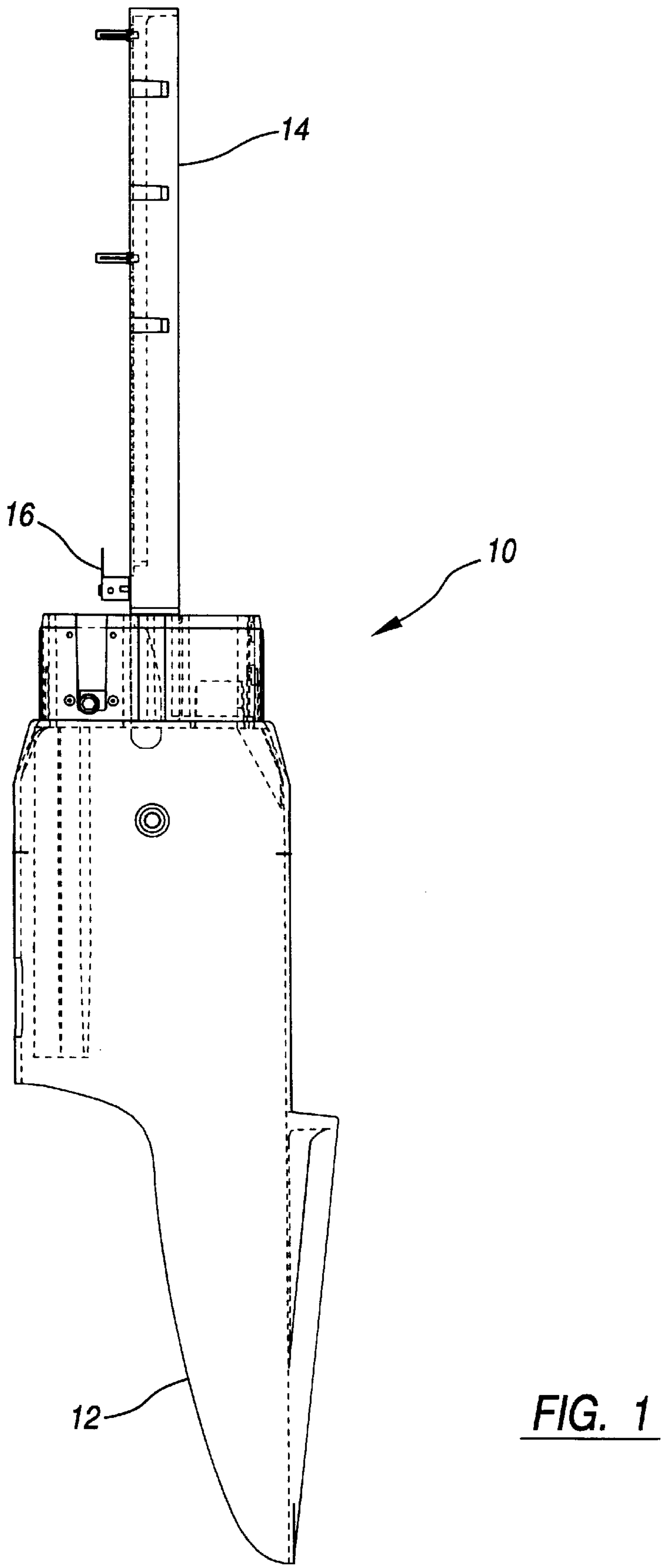
FIG. 1 is a side view of a pedestal constructed according to the principles of the invention and shown with its cover removed.

Referring now to the drawings, and initially to FIG. 1, a pedestal of the type suitable for providing for connection of communications and power cables is designated generally by the reference numeral 10. The pedestal 10 is designed to be partially buried in the ground, and to this end it is provided with an open scoop 12 at its bottom through which direct buried cables may pass up into the pedestal interior. The particular pedestal 10 is advantageously suited for connection of wire pairs used in telecommunications distribution systems. Thus, it is provided with an upstanding universal mounting plate 14. Connected to the plate 14 and as will be described in detail hereinafter is a grounding bracket 16.

Figure 2:
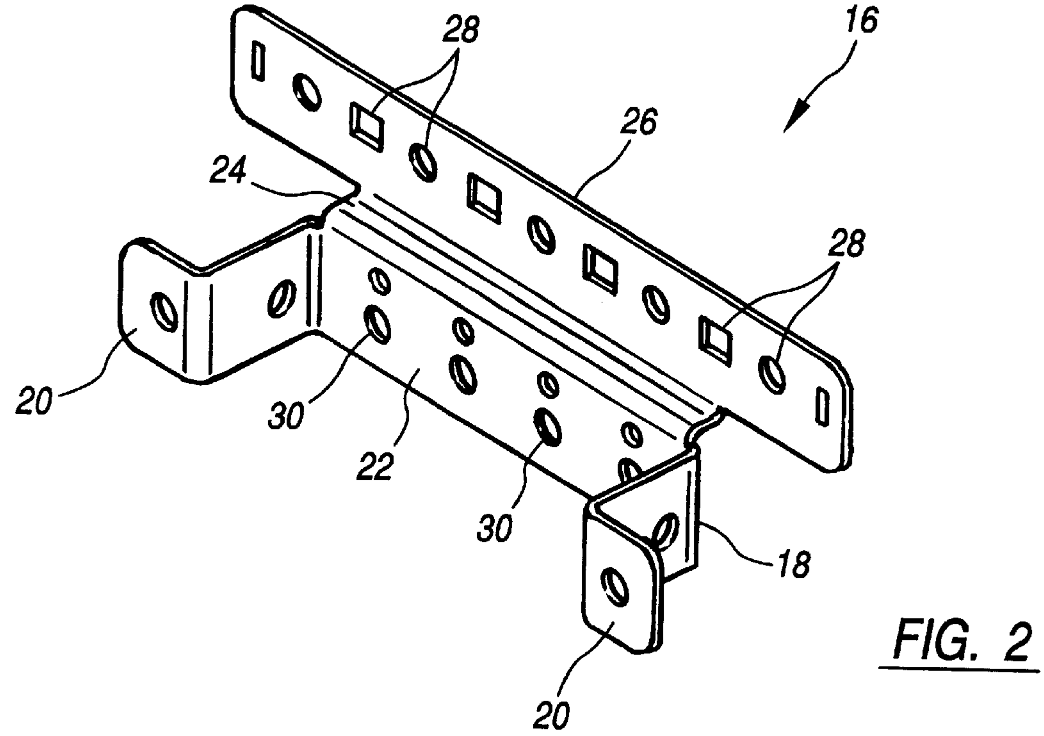
FIG. 2 is a perspective view of a grounding bracket for use in the pedestal of FIG. 1 and constructed in accordance with the invention.

Turning now to FIG. 2, the grounding bracket 16 can be seen in enlarged perspective to be a stamped and formed sheet metal member having a unitary structure. The bracket 16 comprises a generally U-shaped portion 18 formed with laterally extending mounting ears 20. A central bight portion 22 has a laterally extending support portion 24 which, in turn, supports a bar portion 26. The bar portion 26 is formed preferably at a ninety degree angle to the support portion 24 which is preferably formed at a ninety degree angle to the bight portion 22. By this construction, the bar portion 26 is offset from the U-shaped portion 18 and essentially lies in a plane which is spaced from and parallel to a plane containing the mounting ears 20. The bar portion 26 is provided with a series of apertures 28 which may be formed with an internal thread. Similarly, the bight portion 22 is provided with a series of apertures 30 formed with internal threads. The threads are such that they can receive machine screws from either side of the bar portion 26 or bight portion 22.

Figure 3:
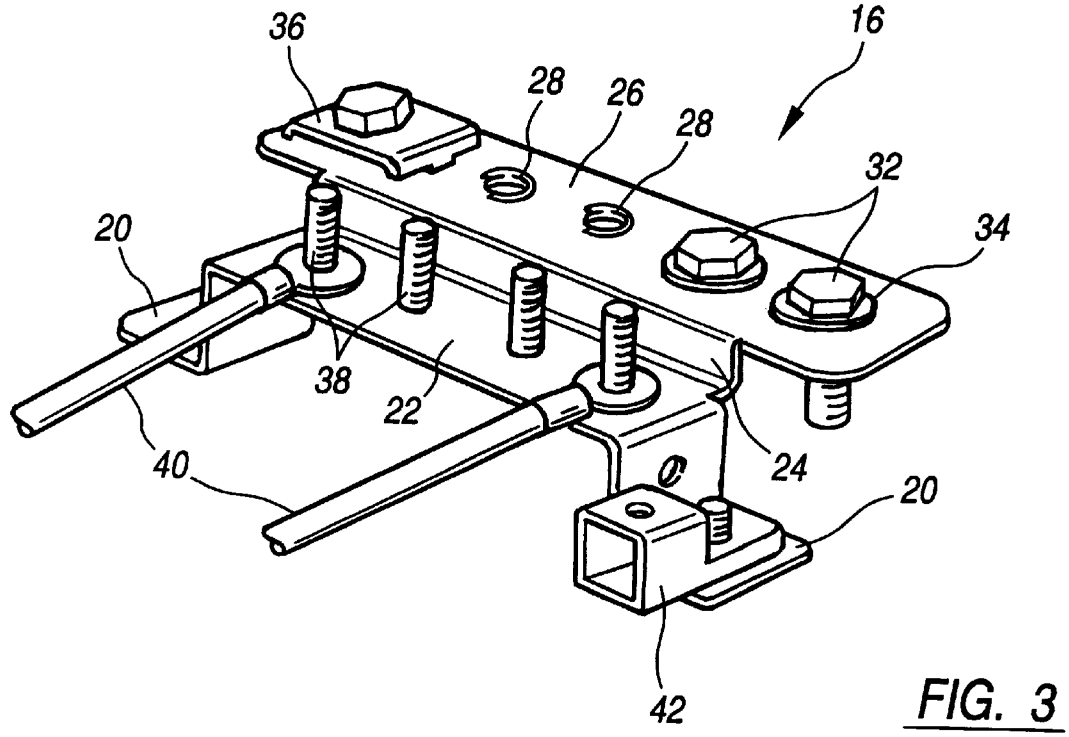
FIG. 3 is a perspective view of the bracket shown with connecting hardware.

Referring now to FIG. 3, the bracket is shown with exemplary forms of hardware to illustrate its versatility. For example, machine screws 32 with washers 34 may be conveniently threaded into the bar portion 26 for purposes of a floating bond. Also, one or more service wire clamps 36 may be threaded into the bar portion 26. The bight portion 22 of the U-shaped portion 18 may be provided with threaded studs 38 to connect, for example, pre-installed ground braids 40. A suitable ground lug 42 may also be used on one of the mounting ears 20 for cable connection to an externally driven ground rod.

It can now be appreciated that a grounding bracket 16 constructed according to the present invention not only offers versatility in grounding both telecommunications and power cables and equipment in pedestal enclosures, its specific construction provides for a high degree of convenience in making grounding connections and routing cables within a pedestal. For example, if desired, cables or wires may be routed to the rear of the bight portion 22 where they can be terminated to the bracket 16 so as to be out of the way of other cables or run behind the bracket to be connected to upper terminal blocks. Moreover, the bracket 16 serves as a single pont ground member which makes grounding of cables and wires a more organized arrangement over prior art grounding systems currently used in pedestal construction.

While the invention has been described in connection with a preferred embodiment, it will be apparent to those skilled in the art that many changes and modifications may be made without department from the true spirit and scope of the present invention. Accordingly, it is intended by the appended claims to cover all such changes and modifications as come within the spirit and scope of the invention.

What is claimed is:

1. A grounding bracket for terminating cables in an electrical equipment enclosure comprising:

a stamped and formed unitary metal member having a generally U-shaped portion with two opposed ends defining a central bight portion having an upper edge;

a first mounting ear extending laterally from a first end of the two opposed ends of the U-shaped portion and a second mounting ear extending laterally from a second end of the two opposed ends of the U-shaped portion;

a support portion extending laterally from the upper edge of the bight portion of the U-shaped portion; and a bar portion extending upwardly at an angle from the support portion so as to be offset from the U-shaped portion and to lie in a plane which is substantially parallel to a plane containing the first and second mounting ears.

2. The bracket of claim 1 wherein the bar portion is provided with a plurality of apertures for receiving metal fasteners.

3. The bracket of claim 1 wherein the bight portion is provided with a plurality of apertures for receiving metal fasteners.

4. The bracket of claim 2 wherein the apertures are configured with internal threads to receive fasteners from either side of the bar portion.

5. The bracket of claim 3 wherein the apertures are configured with internal threads to receive fasteners from either side of the bight portion.

* * * * *